US008455269B2

(12) United States Patent
Miyanagi et al.

(10) Patent No.: US 8,455,269 B2
(45) Date of Patent: Jun. 4, 2013

(54) METHOD FOR RECOVERING AN ON-STATE FORWARD VOLTAGE AND, SHRINKING STACKING FAULTS IN BIPOLAR SEMICONDUCTOR DEVICES, AND THE BIPOLAR SEMICONDUCTOR DEVICES

(75) Inventors: Toshiyuki Miyanagi, Yokosuka (JP); Hidekazu Tsuchida, Yokosuka (JP); Isaho Kamata, Yokosuka (JP); Yoshitaka Sugawara, Osaka (JP); Koji Nakayama, Osaka (JP); Ryosuke Ishii, Osaka (JP)

(73) Assignee: Central Research Institute of Electric Power Industry (JP)

( * ) Notice: Subject to any disclaimer, the term of this patent is extended or adjusted under 35 U.S.C. 154(b) by 256 days.

(21) Appl. No.: 12/376,199

(22) PCT Filed: Aug. 4, 2006

(86) PCT No.: PCT/JP2006/315539
§ 371 (c)(1),
(2), (4) Date: Feb. 3, 2009

(87) PCT Pub. No.: WO2008/015766
PCT Pub. Date: Feb. 7, 2008

(65) Prior Publication Data
US 2009/0195296 A1 Aug. 6, 2009

(51) Int. Cl.
*H01L 21/00* (2006.01)
(52) U.S. Cl.
USPC .................. 438/4; 438/10; 438/309; 257/197
(58) Field of Classification Search
None
See application file for complete search history.

(56) References Cited

U.S. PATENT DOCUMENTS

| | | | |
|---|---|---|---|
| 4,481,403 A * | 11/1984 | Del Monte | 219/209 |
| 6,849,874 B2 | 2/2005 | Sumakeris et al. | |
| 7,915,143 B2 * | 3/2011 | Caldwell et al. | 438/466 |
| 2003/0080842 A1 * | 5/2003 | Sumakeris et al. | 336/77 |
| 2005/0285228 A1 * | 12/2005 | Sugawara | 257/584 |

FOREIGN PATENT DOCUMENTS

WO 03038876 A1 5/2003
WO WO 2005020320 A1 * 3/2005

OTHER PUBLICATIONS

WO 2005020320 A1, Mar. 2005, Machine Translation.*
Huang et al, Temperature Dependence and Post-Stress Recovery of Hot Electron Degradation Effects in Bipolar Transistors, IEEE 1991 Bipolar Circuits and Technology Meeting, pp. 170-173.*
Caldwell et al, Reversal of forward voltage drift in 4H-SiC p-i-n diodes via low temperature annealing, Applied Physics Letters 90, 143519 (2007).*

(Continued)

*Primary Examiner* — Evan Pert
*Assistant Examiner* — Andres Munoz
(74) *Attorney, Agent, or Firm* — The Webb Law Firm

(57) ABSTRACT

In a bipolar semiconductor device such that electrons and holes are recombined in a silicon carbide epitaxial film grown from the surface of a silicon carbide single crystal substrate at the time of on-state forward bias operation; an on-state forward voltage increased in a silicon carbide bipolar semiconductor device is recovered by shrinking the stacking fault area enlarged by on-state forward bias operation. In a method of this invention, the bipolar semiconductor device in which the stacking fault area enlarged and the on-state forward voltage has been increased by on-state forward bias operation, is heated at a temperature of higher than 350° C.

10 Claims, 6 Drawing Sheets

OTHER PUBLICATIONS

Miyanagi et al, Annealing effects on single Shockley faults in 4H-SiC, Applied Physics Letters 89, 062104 (2006).*

Jacobson, H. et al., "Properties and Origins of Different Stacking Faults That Cause Degradation in SiC PiN Diodes", Journal of Applied Physics, Feb. 1, 2004, pp. 1485-1488, vol. 95, No. 3, American Institute of Physics.

Skowronski, M. et al., "Recombination-enhanced Defect Motion in Forward-Biased 4H-SiC p-n diodes", Journal of Applied Physics, Oct. 15, 2002, pp. 4699-4704, vol. 92, No. 8, American Institute of Physics.

Ha, S. et al., "Dislocation Nucleation in 4H Silicon Carbide Epitaxy", Journal of Crystal Growth, 2004, pp. 130-138, vol. 262, Elsevier B.V.

Ryu et al., "Degradation of Majority Carrier Conductions and Blocking Capabilities in 4H-SiC High Voltage Devices due to Basal Plan Dislocations", Materials Research Society, 2008, pp. 251-256, vol. 1069.

Caldwell et al., "Reversal of forward voltage drift in 4H-SiC p-i-n diodes via low temperature annealing", American Institute of Physics, Apr. 6, 2007, Applied Physics Letters 90.

Miyanagi et al., "Annealing effects on single Shockley faults in 4H-SiC", American Institute of Physics, Aug. 7, 2006, Applied Physics Letters 89.

* cited by examiner

After on-state forward bias operation

After heating at 300°C

After heating at 350°C

After heating at 400°C

After heating at 500°C

After heating at 600°C

METHOD FOR RECOVERING AN ON-STATE FORWARD VOLTAGE AND, SHRINKING STACKING FAULTS IN BIPOLAR SEMICONDUCTOR DEVICES, AND THE BIPOLAR SEMICONDUCTOR DEVICES

FIELD OF THE INVENTION

The present invention relates to a method for recovering an on-state forward voltage increased by on-state forward bias operation in a bipolar semiconductor device such that electrons and holes are recombined at the time of on-state forward bias operation in a silicon carbide epitaxial film grown on the surface of a silicon carbide single crystal substrate, a method for shrinking stacking faults which area has been enlarged by on-state forward bias operation, and a bipolar semiconductor device equipped with elements suitable for these methods.

BACKGROUND OF THE INVENTION

Silicon carbide (SiC) is a semiconductor having a dielectric breakdown field intensity about ten times as much as that of silicon (Si), and further having excellent physical values on thermal conductivity, electron mobility and band gap. Accordingly, silicon carbide has been expected as a semiconductor material capable of improving capability of semiconductor elements greatly as compared with conventional Si power semiconductor elements.

Recently, 4H-SiC and 6H-SiC single crystal substrates having a diameter up to 3 inches are on sale, and various kinds of semiconductor switching elements having capabilities remarkably higher than the limit of the Si capability have been reported one after another and the development of high capability SiC semiconductor elements has been progressed.

Semiconductor elements are roughly classified into unipolar semiconductor elements such that only electrons or holes act on electric conduction at the time of on-state forward bias operation, and bipolar semiconductor elements such that both of electrons and holes act on electric conduction at the time of on-state forward bias operation. The unipolar semiconductor elements include schottky barrier diode (SBO), junction field-effect transistor (J-FET), metal/oxide film/semiconductor electric field effect transistor (MOS-FET) and the like. The bipolar semiconductor elements include pn diode, bipolar junction transistor (BJT), thyristor, GTO thyristor, insulated gate bipolar transistor (IGBT) and the like.

When a power semiconductor element is produced using SiC single crystal, a single crystal film having a predetermined film thickness and a predetermined doping concentration is epitaxially grown on a SiC bulk single crystal substrate in the crystal polytype same as the substrate polytype in many cases, because the SiC single crystal has a very small diffusion coefficient and thereby is hardly possible to diffuse impurities deeply (Patent Document 1). Specifically, used is a SiC single crystal substrate, which is prepared by slicing a bulk single crystal obtained with a sublimation method or a chemical vapor deposition method (CVD) and has an epitaxial single crystal film grown with the CVD method on the surface of the substrate.

Examples of SiC single crystals may include various poly type ones (polymorphism type ones). 4H-SiC having high dielectric breakdown field intensity and mobility, and having relatively low anisotropy is used mainly. Examples of the crystal surface on which epitaxial growth is carried out may include (0001)Si surface, (000-1)C surface, (11-20) surface, (01-10) surface and (03-38) surface. When epitaxial growth is carried out on (0001)Si surface and (000-1)C surface, the crystal surface inclined at a several degree to the [11-20] direction or [01-10] direction is used in many cases.

Patent Document 1: Pamphlet of International Publication WO03/038876
Non-Patent Document 1: Journal of Applied Physics Vol. 95 No. 3 2004 pp. 1485 to 1488
Non-Patent Document 2: Journal of Applied Physics Vol. 92 No. 8 2004 pp. 4699 to 4704
Non-Patent Document 3: Journal of Crystal Growth Vol. 262 2004 pp. 130 to 138

As described above, power semiconductor elements prepared using SiC have excellent various properties, but have the following problems. In a SiC single crystal of a SiC bipolar semiconductor element, various crystal defects occur during the production process thereof. Specifically, in the first place, in the process of growing a SiC bulk single crystal by an improved Lely method or the CVD method, various crystal defects occur. In a SiC bipolar semiconductor element prepared using a wafer cut from a SiC bulk single crystal containing such various defects, the crystal defects present in the wafer cause lowering of the properties of the element.

In the second place, in the process of growing a SiC epitaxial film on the surface of a SiC bulk single crystal substrate by the CVD method, various crystal defects are generated in the SiC epitaxial film. One example of the crystal defects is basal plane dislocation.

FIG. 1 is a section showing an interfacial neighborhood between a SiC single crystal substrate and an epitaxial film grown on the surface of the substrate by a step flow growth technique. In FIG. 1, 5 is a crystal surface ((0001)Si surface), and $\theta$ is an off angle. As shown in the figure, many basal plane dislocations 3 which are one of crystal defects are present on the SiC single crystal substrate 1. For example, on a SiC single crystal substrate inclined at an off angle of 8° from the (0001) Si surface, the density of the basal plane dislocation on the substrate surface, which depends on the crystal quality, is typically from $10^2$ to $10^4/cm^2$.

The basal plane dislocations 3 extended parallel to the (0001)Si surface emerge to the surface from the SiC single crystal substrate 1, and then about several % of the basal plane dislocations 3 propagate into an n type epitaxial film 2a and a p type epitaxial film (or a p type implanted layer) 2b as they are at the time of epitaxial growth, and the residual basal plane dislocations 3 are converted to threading edge dislocations 4 and then propagate into the n type epitaxial film 2a and the p type epitaxial film (or p type implanted layer) 2b.

In a bipolar element such as pn diode or the like, the n type epitaxial film, and the interfacial neighborhood between the n type epitaxial film and the p type epitaxial film, or the interfacial neighborhood between the n type epitaxial film and the p type injection film become a region where electrons and holes are recombined at the time of on-state forward bias operation, but the basal plane dislocations 3 are converted into stacking faults by recombination energy of electrons and holes generated at the time of on-state forward bias operation (referred to the non-patent documents 1 to 3). The stacking faults occur as plane-like defects 31 having a triangle shape or the like, as shown in FIG. 4.

The basal plane dislocations have ⅓[10-20] Burgers vectors, but are present in a state of being divided into two Shockley partial dislocations of ⅓[10-10] and ⅓[01-10] (sometimes referred to Shockley type imperfect partial dislocations). Narrow regions, which are interspaces between these partial dislocations, form stacking faults. These stacking faults are called as Shockley type stacking faults. It is considered that one of the partial dislocations is moved by recombination energy of electrons and holes, and thereby the stacking fault area is enlarged.

Since the region of the stacking faults acts as a high resistant region at the time of on-state forward bias operation, the on-state forward voltage of the bipolar element is increased with the enlargement of the area of the stacking faults.

In the process for growing a SiC epitaxial film from the surface of a SiC single crystal substrate by the CVD method, various crystal defects are generated except for the basal plane dislocations. Specifically, crystal faults, for example, point defects, edge dislocations, screw dislocations and line defects with mixed component, loop-shape defects thereof occur in the SiC single crystal epitaxial film. Furthermore, it is considered that after forming the film by the CVD method, a strain will occur in the crystal at the time of decreasing the temperature, and crystal defects as described above will be generated at this time. It is further considered that particularly, many crystal defects as described above are present on the surface layer of the SiC epitaxial film.

As described above, since the inside of the SiC epitaxial film becomes a region where electrons and holes are recombined at the time of on-state forward bias operation, it is also considered that the above crystal defects will be converted into plane-like stacking faults by recombination energy of electrons and holes generated at the time of on-state forward bias operation. As described above, the stacking fault region acts as a high resistant region at the time of on-state forward bias operation, and thereby the voltage in the forward direction of the bipolar element is increased.

In the third place, after the SiC epitaxial film is formed on the surface of the SiC bulk single crystal substrate, the SiC bipolar semiconductor element is produced through various steps including mesa structure formation, ion implantation, oxide film formation, electrode formation, or the like. The above crystal defects also are generated in the step of processing the SiC single crystal substrate. For example, since the SiC bulk single crystal has a low constant of diffusing impurity atoms and it is difficult for the SiC bulk single crystal to apply impurity doping by thermal diffusion, nitrogen ion or aluminum ion is optionally introduced into the SiC epitaxial film by ion implantation. At the time of forming JTE in pn diode, ion implantation is also carried out for the SiC epitaxial film. It is considered that at the time of ion implantation, impurity ions derived into the crystal inside strike the SiC single crystal to destroy the crystal structure of the crystal, and thereby the SiC single crystal is damaged to cause occurrence of the above crystal defects.

As described above, various crystal defects are generated in the inside of the SiC single crystal in a step of forming the SiC single crystal substrate, in a step of forming the SiC epitaxial film and in a subsequent step of processing the SiC substrate. The crystal defects cause lowering of the properties of the SiC bipolar semiconductor element prepared, and particularly, the crystal defects present in the inside of the SiC epitaxial film by on-state forward bias operation become plane-like stacking faults. Furthermore, the area of the stacking faults is enlarged, to increase the voltage in the forward direction. The increase of the forward voltage lowers the reliability of SiC bipolar semiconductor element and induces increase of electric power loss in an electric power-controlling device equipped with the SiC bipolar semiconductor element. Therefore, there is a subject such that the forward voltage increased is recovered by shrinking the stacking faults enlarged by on-state forward bias operation.

The present invention is intended to solve the problems associated with the above prior arts, and it is an object of the present invention to recover the forward voltage increased in a silicon carbide bipolar semiconductor device by shrinking the stacking fault area enlarged by energizing.

SUMMARY OF THE INVENTION

Stacking faults enlarged by on-state forward bias operation are reduced by heating at a temperature of higher than 350° C. Specifically, plane-like stacking faults become linear stacking faults. Based on these findings, the present inventors found that applying heating at a temperature of higher than 350° C. to a silicon carbide bipolar semiconductor device in which the forward voltage is increased by on-state forward bias operation, plane-like stacking faults enlarged by on-state forward bias operation are shrunk to be linear stacking faults before the on-state forward bias operation and thereby the forward voltage increased is recovered. Thus, the present invention has been accomplished.

The method for recovering a voltage in a forward direction in a bipolar semiconductor device according to the present invention is a method for recovering an on-state forward voltage increasing in a bipolar semiconductor device such that electrons and holes are recombined in a silicon carbide epitaxial film grown on the surface of a silicon carbide single crystal substrate at the time of on-state forward bias operation, wherein the method comprises heating the bipolar semiconductor device in which the on-state forward voltage has been increased by on-state forward bias operation, at a temperature of higher than 350° C.

The method for recovering an on-state forward voltage increasing in a bipolar semiconductor device according to the present invention is characterized in that using a temperature-controlling device for heating the bipolar semiconductor device, the bipolar semiconductor device is heated at a temperature of higher than 350° C.

The method for recovering an on-state forward voltage increasing in a bipolar semiconductor device according to the present invention is characterized by using the bipolar semiconductor device, which comprises a hexagonal silicon carbide single crystal substrate such that a hexagonal silicon carbide epitaxial film is grown on the surface of the substrate.

The method for recovering an on-state forward voltage increasing in a bipolar semiconductor device according to the present invention is characterized by using the bipolar semiconductor device which comprises a 4H silicon carbide single crystal substrate such that a 4H silicon carbide epitaxial film is grown on the surface of the substrate, a 6H silicon carbide single crystal substrate such that a 6H silicon carbide epitaxial film is grown on the surface of the substrate, or a 2H silicon carbide single crystal substrate such that a 2H silicon carbide epitaxial film is grown on the surface of the substrate.

The method for recovering an on-state voltage in a forward direction in a bipolar semiconductor device according to the present invention is characterized by using the bipolar semiconductor device, which comprises a 15R silicon carbide single crystal substrate such that a 15R silicon carbide epitaxial film is grown on the surface of the substrate.

The method for shrinking stacking faults in a bipolar semiconductor device according to the present invention is a method for shrinking stacking faults in a bipolar semiconductor device such that electrons and holes are recombined in a silicon carbide epitaxial film grown from the surface of a silicon carbide single crystal substrate at the time of on-state forward bias operation, which method comprises heating the bipolar semiconductor device in which the area of stacking faults in the silicon carbide epitaxial film has been enlarged by on-state forward bias operation, at a temperature of higher than 350° C.

The method for shrinking stacking faults in a bipolar semiconductor device according to the present invention is characterized in that using a temperature-controlling device for heating the bipolar semiconductor device, the bipolar semiconductor device is heated at a temperature of higher than 350° C.

The method for shrinking stacking faults in a bipolar semiconductor device according to the present invention is characterized by using the bipolar semiconductor device, which comprises a hexagonal silicon carbide single crystal substrate such that a hexagonal silicon carbide epitaxial film is grown on the surface of the substrate.

The method for shrinking stacking faults in a bipolar semiconductor device according to the present invention is characterized by using the bipolar semiconductor device, which comprises a 4H silicon carbide single crystal substrate such that a 4H silicon carbide epitaxial film is grown on the surface of the substrate, a 6H silicon carbide single crystal substrate such that a 6H silicon carbide epitaxial film is grown on the surface of the substrate, or a 2H silicon carbide single crystal substrate such that a 2H silicon carbide epitaxial film is grown on the surface of the substrate.

The method for shrinking stacking faults in a bipolar semiconductor device according to the present invention is characterized by using the bipolar semiconductor device, which comprises a 15R silicon carbide single crystal substrate such that a 15R silicon carbide epitaxial film is grown on the surface of the substrate.

The bipolar semiconductor device of the present invention is a bipolar semiconductor device such that electrons and holes are recombined in a silicon carbide epitaxial film grown on the surface of a silicon carbide single crystal substrate at the time of on-state forward bias operation, wherein
a bipolar semiconductor element, and
a temperature-detecting element for detecting the temperature of the bipolar semiconductor element in heating the bipolar semiconductor element in a condition of stopping on-state forward bias operation at a temperature of 350° C. or higher in order to recover a voltage in the forward direction increased by on-state forward bias operation in the bipolar semiconductor element
are formed on the silicon carbide single crystal substrate.

The bipolar semiconductor device of the present invention is a bipolar semiconductor device such that electrons and holes are recombined in a silicon carbide epitaxial film grown on the surface of a silicon carbide single crystal substrate at the time of on-state forward bias operation, wherein
a bipolar semiconductor element,
a heater for heating the bipolar semiconductor element at a temperature of 350° C. or higher in a condition of stopping energizing in order to recover a forward voltage increased by on-state forward bias operation in the bipolar semiconductor element, and
a temperature-detecting element for detecting the temperature of the bipolar semiconductor element in heating the bipolar semiconductor element by the heater
are formed on the silicon carbide single crystal substrate.

The bipolar semiconductor device of the present invention is a bipolar semiconductor device such that electrons and holes are recombined in a silicon carbide epitaxial film grown on the surface of a silicon carbide single crystal substrate at the time of on-state forward bias operation, wherein
a bipolar semiconductor element, and
a temperature-detecting element for detecting the temperature of the bipolar semiconductor element in heating the bipolar semiconductor element in a condition of stopping on-state forward bias operation at a temperature of 350° C. or higher in order to shrink the area of stacking faults increased by on-state forward bias operation in the bipolar semiconductor element
are formed on the silicon carbide single crystal substrate.

The bipolar semiconductor device of the present invention is a bipolar semiconductor device such that electrons and holes are recombined in a silicon carbide epitaxial film grown on the surface of a silicon carbide single crystal substrate at the time of on-state forward bias operation, wherein
a bipolar semiconductor element,
a heater for heating the bipolar semiconductor element at a temperature of 350° C. or higher in a condition of stopping on-state forward bias operation in order to shrink the area of stacking faults increased by on-state forward bias operation in the bipolar semiconductor element, and
a temperature-detecting element for detecting the temperature of the bipolar semiconductor element in heating the bipolar semiconductor element by the heater
are formed on the silicon carbide single crystal substrate.

According to the present invention, an on-state forward voltage increased by on-state forward bias operation in a SiC bipolar semiconductor element can be recovered to be the former condition before the on-state forward bias operation.

According to the present invention, the area of stacking faults enlarged by on-state forward bias operation can be shrunk.

BEST MODE FOR CARRYING OUT THE INVENTION

Figure 1:
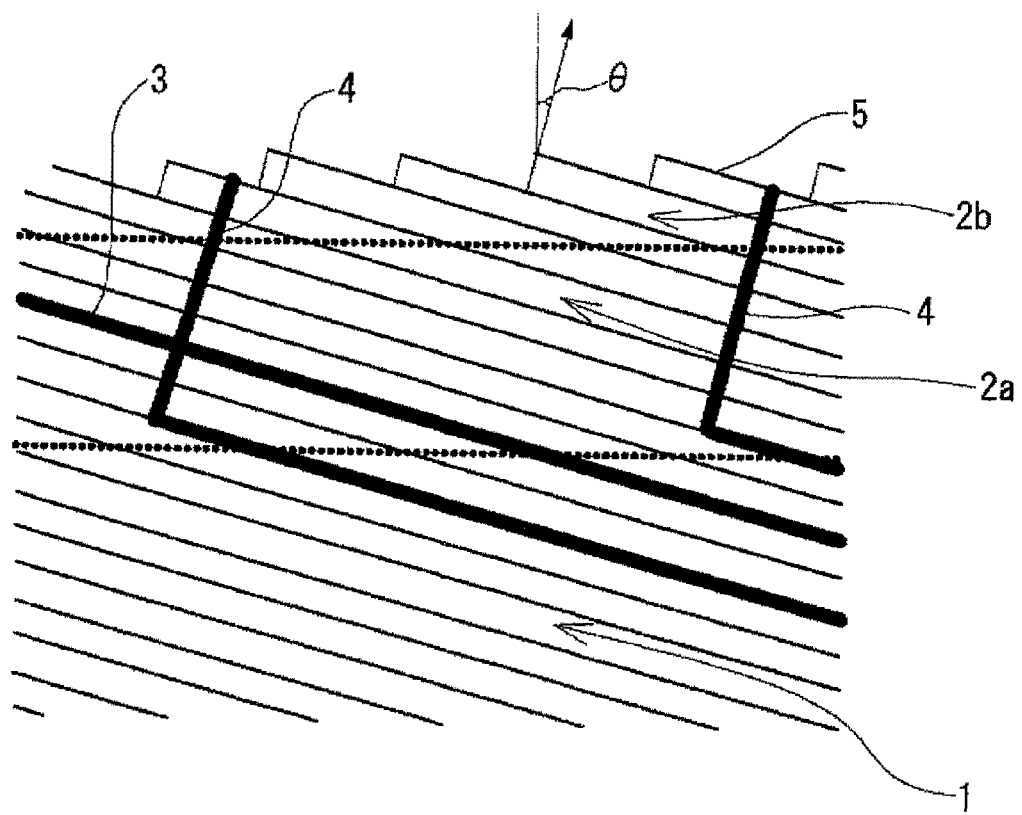
FIG. 1 is a section showing an interfacial neighborhood of a SiC single crystal substrate and an epitaxial film formed on the surface of the substrate by a step flow growth technique.

The present invention will be described with reference to the drawings below.

The individual direction is represented by [ ], and the individual plane is represented by ( ) with respect to a lattice direction and a lattice plane. Although the minus index is normally represented by adding "−" on a number in the crystallography, it is represented by adding "−" before a number in convenient for preparing the specification. Furthermore, the description "bipolar semiconductor element" represents a single semiconductor element formed on a substrate, and the description "bipolar semiconductor device" represents not only the single semiconductor element but also a whole element structure in which plural element structures are formed on a substrate, and a formation in which a substrate formed with elements is held in a package.

In the present invention, SiC bipolar semiconductor elements, which have been used conventionally, are used. A SiC single crystal substrate that a SiC epitaxial single crystal film is grown from the surface thereof is used as a semiconductor substrate for forming electrodes.

A substrate prepared by slicing a bulk crystal obtainable by a sublimation method or a CVD method is used as the SiC single crystal substrate. In the preparation with the sublimation method (modified Lely method), for example, powdery SiC is put into a crucible and vaporized by heating at a temperature of from 2200 to 2400° C., to deposit on the surface of a seed crystal at a typical rate of 0.8 to 1 mm/h, and thereby bulk growth is performed. The resulting ingot is sliced in a prescribed thickness so that a desired crystal surface appears. In order to suppress propagation of basal plane dislocation to an epitaxial film, the surface of a wafer cut is smoothed so as to have a mirror surface by a treatment such as polishing treatment using a polishing abrasive grain, hydrogen etching or chemical mechanical polishing (CMP).

From the surface of the SiC single crystal substrate, the SiC single crystal epitaxial film is grown. The kinds of SiC single crystals may include crystal polymorphism type (poly type) crystals. For example, 4H-SiC, 6H-SiC, 2H-SiC and 15R-SiC are used as the SiC single crystal substrate. Among them, 4H-SiC has high dielectric breakdown field intensity and mobility, and relatively low anisotropy. Examples of the crystal surface on which epitaxial growth is carried out may include (0001)Si surface, (000-1)C surface, (11-20) surface, (01-10) surface and (03-38) surface.

In the case that epitaxial growth is carried out on the (0001) Si surface or (000-1)C surface, a substrate prepared by cutting a substrate inclined at an off angle of, for example, 1 to 12° toward an off direction of [01-10] direction, [11-20] direction or the middle direction between [01-10] direction and [11-20] direction, is used, and SiC is subjected to epitaxial growth from this crystal surface by a step flow growth technique.

The epitaxial growth of the SiC single crystal film is carried out by the CVD method. Propane or the like is used as a source gas for C, and silane or the like is used as a source gas for Si. A mixed gas, which comprises these source gases, a carrier gas such as hydrogen or the like, and a dopant gas, is fed to the surface of the SiC single crystal substrate. As the dopant gas, nitrogen or the like is used in the case that an n type epitaxial layer is grown, and trimethylaluminum or the like is used in the case that a p type epitaxial layer is grown.

The epitaxial growth of SiC is carried out in an atmosphere of these gases, at a temperature of from 1500 to 1600° C. under a pressure of from 40 to 80 Torr at a growth rate of 2 to 20 µm/h. By the epitaxial growth, SiC having the same crystal polytype as that of the SiC single crystal substrate is step flow grown.

As a specific device for carrying out epitaxial growth, a vertical hot wall furnace can be used. The vertical hot wall furnace is provided with a water-cooling double cylindrical tube made of quartz, and in the water-cooling double cylindrical tube, a cylindrical insulating material, a hot wall formed by graphite, and a wedge shaped susceptor for keeping the SiC single crystal substrate to the longitudinal direction are provided. On the outside circumference of the water-cooling double cylindrical tube, an RF heating coil is provided. The hot wall is heated with high frequency induction by the RE heating coil and the SiC single crystal substrate kept with the wedge shaped susceptor is heated by radiant heat conducted from the hot wall. While the SiC single crystal substrate is heated, a reaction gas is fed from the lower part of the water-cooling double cylindrical tube and thereby SiC is epitaxially grown on the surface of the SiC single crystal substrate.

Using the SiC single crystal substrate having the epitaxial film thus formed, a bipolar element is prepared. Hereinafter, one embodiment of a method for producing a pn (pin) diode, which is one of bipolar elements, will be described with reference to FIG. 2. On an n type 4H-SiC single crystal substrate 21 (carrier density: $8 \times 10^{18}$ cm$^{-3}$, thickness: 400 µm) prepared by slicing an ingot grown by an modified Lely method at a prescribed off angle and subjecting the surface to mirror surface treatment, a nitrogen doped n type SiC layer (drift layer 23: donor density $5 \times 10^{14}$ cm$^{-3}$, film thickness 40 µm) and an aluminum doped p type SiC layer (p type junction layer 24: acceptor density $5 \times 10^{17}$ cm$^{-3}$, film thickness 1.5 µm, and p+ type contact layer 25: acceptor density $1 \times 10^{18}$ cm$^{-3}$, film thickness 0.5 µm) are epitaxially grown in this order by the CVD method.

Next, the outer periphery of the epitaxial film is removed by reactive ion etching (RIE) for forming a mesa structure. In order to form the mesa structure, a Ni metal film is deposited on the epitaxial film. For the evaporation, an electron beam heating evaporating device is used. The electron beam heating evaporating device is equipped with an electron ray generator, a crucible for putting a Ni metal target, and a substrate holder in which the SiC single crystal substrate is kept so that the surface of the epitaxial film faces toward the outside. The Ni metal piece is molten by irradiating electron beam accelerated at about 10 kV to the Ni metal target put in the crucible, and deposited on the epitaxial film.

On the surface of the Ni metal film deposited on the epitaxial film, a photoresist for patterning a mesa structure is applied in a thickness of 1 µm using a spin coater and then the resist film is treated with heat in an oven. The resist film is exposed to ultraviolet rays through a mask corresponding to the pattern having a mesa structure and developed using a resist developer. The Ni metal film exposed on the substrate surface by the development is removed with an acid, and then the epitaxial film exposed on the substrate surface by removing the Ni metal film is etched by RIE using a mixed gas of carbon tetrafluoride and oxygen, to form a mesa having a pitch width of 4 µm.

Next, in order to relax the electric field concentration in the mesa bottom, JTE (junction termination extension) 26 is formed by implanting aluminum ion. The JTE 26 has a total dose amount of $1.2 \times 10^{13}$ cm$^{-2}$, a width of 250 µm and a depth of 0.7 µm. Implanting ion with changing energy at 30 to 450 keV successively, the implanted aluminum ion has a concentration distribution such that the concentration in a depth direction is constant. After the ion implanting, aluminum ion is activated by carrying out annealing treatment in an argon gas atmosphere.

Next, an oxide film 27 for protecting the element surface is formed. In order to carry out heat oxidation, the substrate is put into a heat oxidation furnace and heated while feeding a dried oxygen gas, and thereby a 40 nm thick film oxidized with heat is formed over the whole substrate surface. Thereafter, prescribed parts for forming electrodes on the substrate surface are subjected to patterning by a photolithography technique, and then the heat-oxidized film of these parts is removed by a hydrofluoric acid and thereby the epitaxial film is exposed.

In the next step, a cathode electrode 28 and an anode electrode 29 are deposited using an electron beam heat evaporation device. The cathode electrode 28 is formed by evaporating Ni (350 nm thick) on the backside surface of the substrate 21. The anode electrode 29 is formed by evaporating a Ti film (100 nm thick) and an Al film (350 nm thick) in this order on the upper surface of the p+ type contact layer 25. These electrodes are formed into an alloy with SiC by heat treatment after the deposition, and thereby made into an ohmic electrode.

In the present invention, the SiC bipolar semiconductor element which has been increased the on-state forward voltage by on-state forward bias operation is heated at a temperature of higher than 350° C., preferably 400 to 800° C., more preferably 400 to 700° C. When the temperature is over 700° C., normal operation cannot be carried out occasionally because the metal materials constituting the electrodes are sometimes molten, while when it is over 800° C., the properties of the bipolar semiconductor element are optionally affected. By heating the SiC bipolar semiconductor element which voltage in the forward direction has been increased by enlargement of the area of stacking faults due to on-state forward bias operation, in the above temperature range, the enlarged area of stacking faults is shrunk and the increased forward voltage can be recovered to the forward voltage near the former forward voltage before the on-state forward bias operation. That is to say, as shown in the examples described later, the area of stacking faults enlarged at around 350° C. is shrunk and the increased voltage in the forward direction is recovered.

It is considered this phenomenon is caused by the following reasons. As described above, in the bipolar semiconductor elements such as pn diode or the like, an n type epitaxial film, and the interfacial neighborhood between the n type epitaxial film and a p type epitaxial, or the interfacial neighborhood between the n type epitaxial film and the p type implantation layer make a region for recombining electrons and holes at the time of on-state forward bias operation, and thereby a basal plane dislocation propagated into the epitaxial film from the SiC single crystal substrate is transformed to stacking faults by this recombination energy. As the region on which the stacking faults are formed acts as a high resistant region at the time of on-state forward bias operation, the voltage in the forward direction of the bipolar semiconductor element is increased with the enlargement of the stacking fault area.

However, it is considered that since by heating under a temperature condition of higher than 350° C., Si atom and C atom, which will form stacking faults, are more stable in a normal lattice position rather than in a stacking fault state and thereby stacking faults are shrunk and as a result, the voltage in the forward direction is recovered to the former voltage before the on-state forward bias operation. The stacking faults can be confirmed by observing the epitaxial film as an X ray topography image, a photoluminescence image, an electroluminescence image or a cathode luminescence image.

Figure 3:
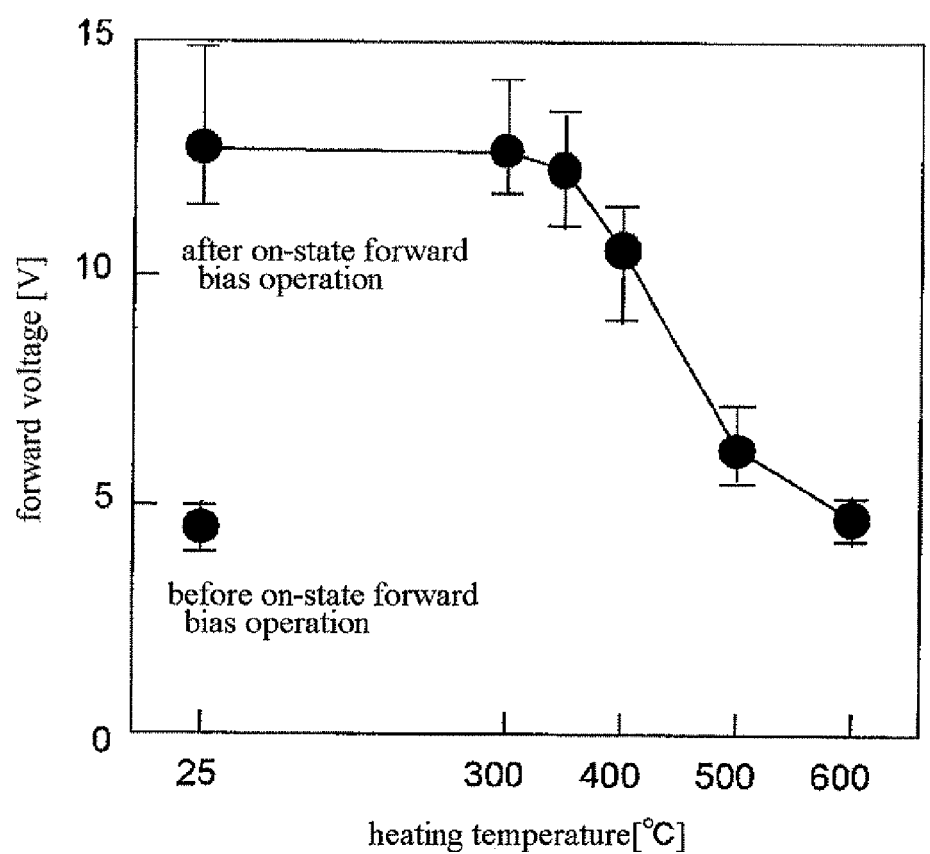
FIG. 3 is a graph showing results of on-state forward bias operation tests in examples and comparative examples, which graph shows a relation between a heating temperature for a pn diode and a voltage in the forward direction after an on-state forward bias operation test.

Plural of pn diodes were prepared using a 4H crystal type SiC, and on-state forward bias operation for these pn diodes was carried out at a current density of 100 A/cm$^2$ for 60 min and thereafter heating was carried out at each temperature of from 300° C. to 600° C. As a result, as shown in FIG. 3, in the diodes heated at a temperature lower than 300° C., the recovery of the forward voltage is not confirmed. On the other hand, in the diodes heated at a temperature of 350° C., the recovery of the forward voltage is clearly confirmed, and as the heating temperature is more increased, the forward voltage is gradually recovered. In the diodes heated at a temperature higher than 400° C., the forward voltage is largely recovered, and further, in the diodes heated at a temperature higher than 600° C., the forward voltage is recovered to the former voltage before the on-state forward bias operation.

As described above, heating at a temperature of higher than 350° C. for the SiC bipolar semiconductor elements which voltage in the forward direction increases by on-state forward bias operation can decrease the voltage in forward direction to the former voltage before the on-state forward bias operation.

However, as it is considered that this phenomenon does not depend on the crystal surface orientation on which epitaxial growth is carried out, for example, even if (0001) Si surface, (000-1) C surface, (11-20) surface, (01-10) surface and (03-38) surface are submitted to the crystal surface orientation on which epitaxial growth is carried out, the effect same as above can be obtained. In particular, when the angle meeting the stacking fault surface and the direction of the route of passing an electric current is large, for example, the stacking fault surface vertically intercepts the route of passing an electric current, the voltage in the forward direction can be recovered largely because the stacking faults largely affects the on-state forward bias operation deterioration.

The SiC single crystals include a plurality of crystal types. It is considered that the above phenomenon is caused by the fact that the SiC single crystal is stabilized under a temperature condition of higher than 350° C. Therefore, in the case of using 4H-SiC (4-layer stacking sequenced hexagonal type) as well as 6H-SiC (6-layer sequenced hexagonal), 2H-SiC (2-layer sequenced hexagonal) or 15R-SiC (15-layer sequenced rhombohedral), the voltage can be largely recovered from deterioration due to energizing similarly.

In bipolar semiconductor elements such that electrons and holes are recombined in the silicon carbide epitaxial film grown on the surface of the silicon carbide single crystal substrate at the time of on-state forward bias operation, even in other bipolar elements except for pn diode, the silicon carbide epitaxial film is stabilized by heating at the above temperature and thereby the stacking faults enlarged by on-state forward bias operation can be shrunk and the voltage in the forward direction increased is recovered. Examples of the SiC bipolar semiconductor elements may include thyristors, gate turn off thyristors (GTO thyristors), insulated gate bipolar transistors (IGBT) and bipolar junction transistors (BJT).

The SiC bipolar semiconductor elements are used in household electric appliance, industrial electric fields, car fields such as electric vehicles, railways and the like, and electric powder fields such as power supply and the like. For example, they are set in an electric power-controlling device such as inverter and submitted to use. In applying the present invention to an SiC bipolar semiconductor element set in an electric power-controlling device and the like actually, it is preferable to equip a temperature-controlling device for heating the SiC bipolar semiconductor element to a prescribed temperature.

This temperature-controlling device is equipped with at least a heating means for heating the SiC bipolar semiconductor element. Examples of the heating means may include a heater built in a package of a SiC bipolar semiconductor element, and a heater formed in a SiC single crystal substrate prepared in a SiC bipolar semiconductor element.

The temperature-controlling device may be equipped with a temperature-detecting means for measuring a temperature of the SiC bipolar semiconductor element. Examples of the temperature-detecting means may include a temperature sensor built in a heater, a temperature sensor built in a package of a SiC bipolar element, and a temperature-detecting element formed in a SiC single crystal substrate prepared in a SiC bipolar semiconductor element.

In this way, heating the SiC bipolar semiconductor element provided with the temperature-controlling device at a temperature higher than 350° C. effectively shrink the area of stacking faults enlarged and thereby the increased voltage in the forward direction can be recovered effectively.

The temperature-controlling device is connected with an operation-controlling device for controlling current on-state operation in a SiC bipolar element and thereby, for example, the following controls are carried out so as to carry out recovering operation of the forward voltage with heating at a prescribed time. When the operation-controlling device detects that the voltage in the forward direction increases to a prescribed value, or energizing for a prescribed time is carried out, the SiC bipolar element is heated by the heater to at least a temperature of higher than 350° C. while the on-state forward bias operation is stopped and the temperature sensor detects the temperature of the element. After the area of stacking faults enlarged by heating is shrunk and thereby the on-state forward voltage is recovered, on-state forward bias operation to the SiC bipolar element is started at the former temperature by the operation-controlling device.

Figure 5:
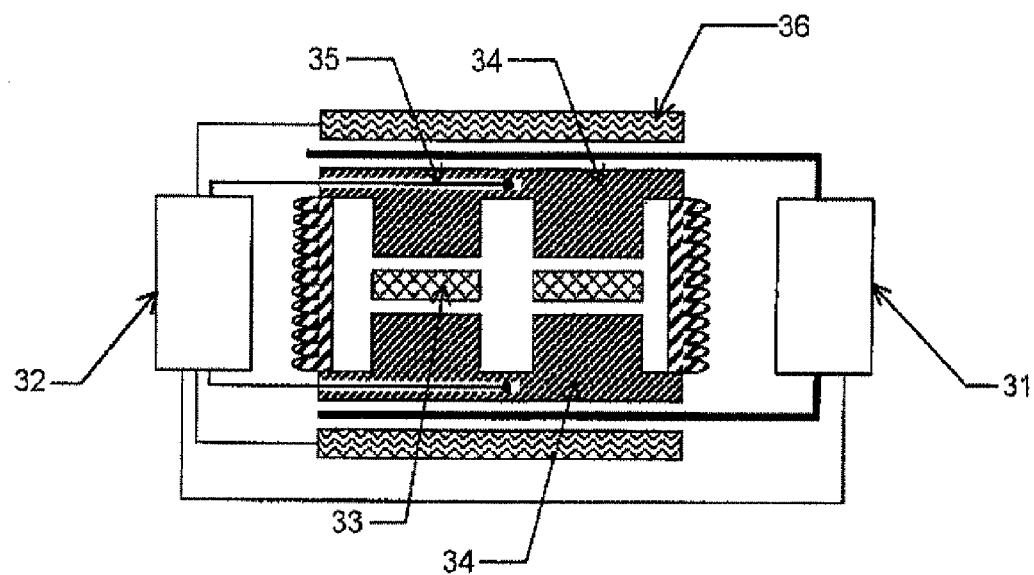
FIG. 5 is a view illustrating one embodiment such that a temperature-controlling device for controlling the temperature of a SiC bipolar element is provide.
Figure 6:
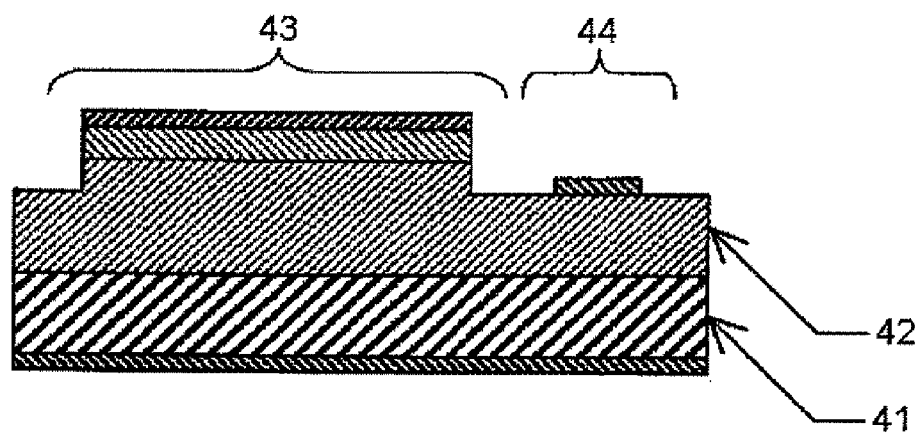
FIG. 6 is a view illustrating one embodiment such that a temperature-controlling device for controlling the temperature of a SiC bipolar element is provided.
Figure 7:
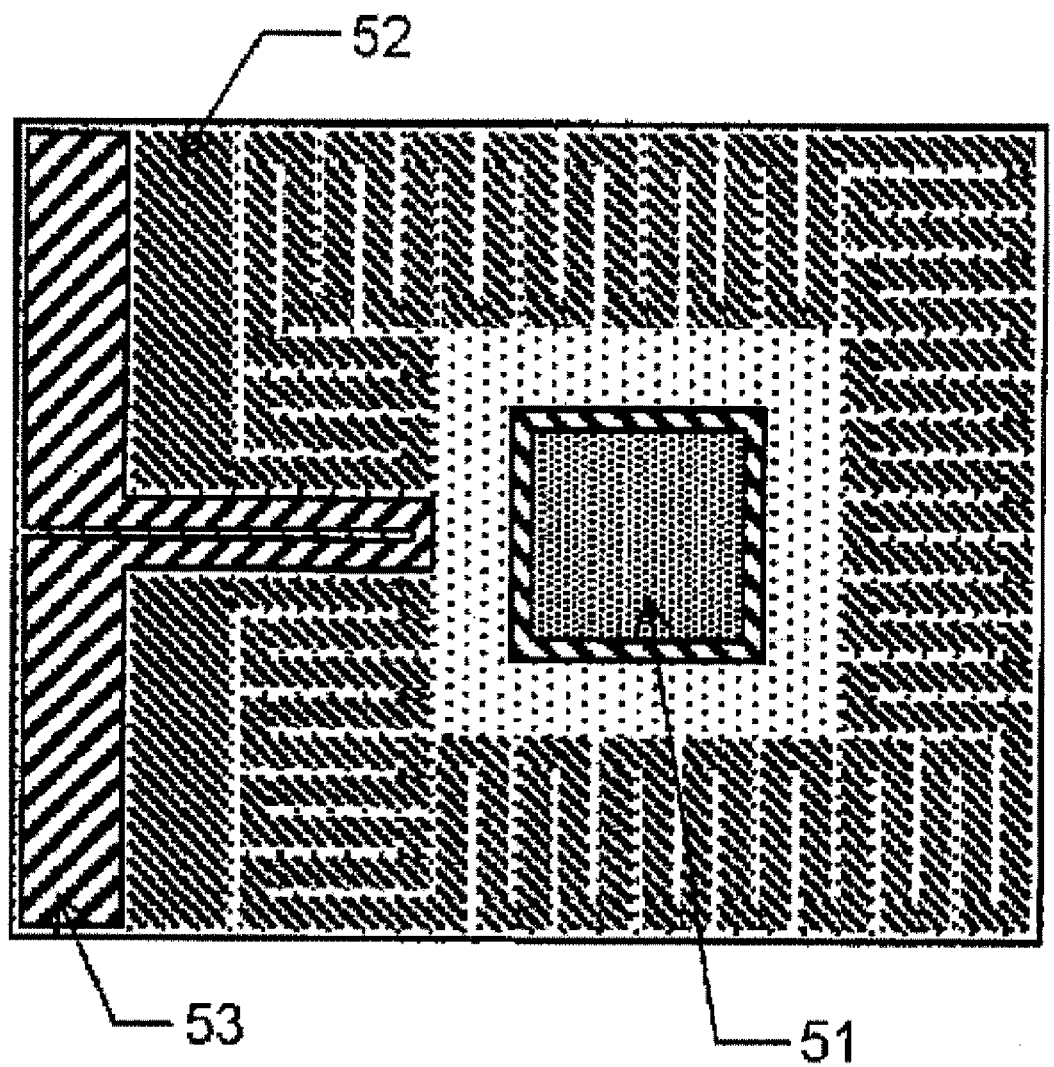
FIG. 7 is a view illustrating one embodiment such that a temperature-controlling device for controlling the temperature of a SiC bipolar element is provided.

FIGS. 5 to 7 show embodiments provided with the above temperature-controlling device. In FIG. 5, a temperature-controlling device 32 equipped with heaters 36 in the outside of a package and temperature sensors 35 in the inside of the package is connected to an operation-controlling device 31 in which energizing through electrodes 34 is passed to the bipolar elements 33, and thereby when stacking faults are enlarged by on-state forward bias operation and the voltage in the forward direction is increased, the SiC bipolar element 33 is heated by the heater 36 while the temperature sensor 35 detects the temperature of the element.

In FIG. 6, on a SiC single crystal substrate 41 formed with an epitaxial film 42, both of a pn diode 43 and a temperature-detecting element 44 are formed. When stacking faults are enlarged by on-state forward bias operation and the voltage in the forward direction is increased in the pn diode 43, the pn diode 43 is heated to a temperature of higher than 350° C. while on-state forward bias operation is stopped and the temperature of the pn diode 43 is measured by the temperature-detecting element 44, and thereby stacking faults in the pn diode 43 are shrunk and the voltage in the forward direction is recovered.

In FIG. 7, on the same SiC single crystal substrate, a pn diode 51, a heater 52 and a temperature-detecting element 53 are formed. When stacking faults are enlarged by on-state forward bias operation and the voltage in the forward direction is increased in the pn diode 51, the pn diode 51 is heated to a temperature of higher than 350° C. by the heater 52 while on-state forward bias operation is stopped and the temperature of the pn diode 51 is measured by the temperature-detecting element 53, and thereby stacking faults in the pn diode 51 are shrunk and the voltage in the forward direction is recovered.

The embodiments of the present invention were described above, but the present invention should not be limited by the above embodiments, and variations and modifications may occur without departing from the scope of the present invention.

EXAMPLES

The present invention will be described with reference to the following examples below. Needless to say, the present invention should not be limited by the examples.

Example 1

Figure 2:
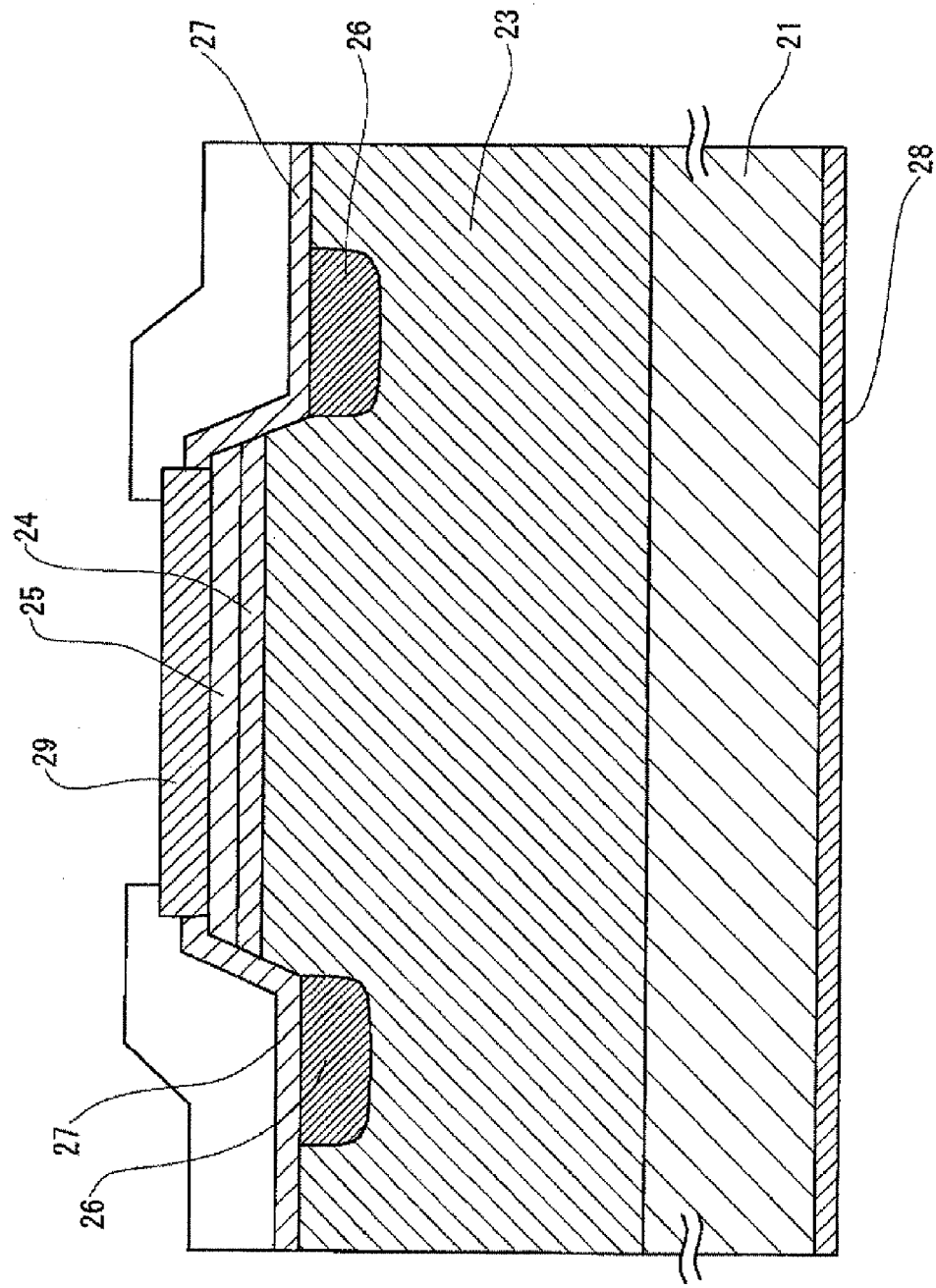
FIG. 2 is a section of a pn diode prepared by using a SiC single crystal substrate that an epitaxial film is formed on the surface thereof.

A pn diode as shown in FIG. 2 was prepared for test. On an n type 4H-SiC (0001) substrate (carrier density of $8 \times 10^{18}$ cm$^{-3}$, 400 µm thick) prepared by slicing an ingot grown by the modified Lely method in an off direction of [11-20] at an off angle of 8° and mirror treating the surface, a nitrogen doped n type SiC layer (donor density of $5 \times 10^{14}$ cm$^{-3}$, 40 µm thick), and an aluminum doped p type SiC layer (p type junction layer: acceptor density of $5 \times 10^{17}$ cm$^{-3}$, 1.5 µm thick and p+ type contact layer: acceptor density of $1 \times 10^{18}$ cm$^{-3}$, 0.5 µm thick) were epitaxially grown in this order.

Next, the outer peripheral part of the epitaxial film was removed by reacting ion etching (RIE) and a mesa structure having a vertical width of 4 µm was formed. In order to ease the electric field concentration in the mesa bottom, aluminum ions were implanted to the mesa bottom and thereby a JTE having a total dose amount of $1.2 \times 10^{13}$ cm$^{-2}$, a width of 250 µm and a depth of 0.7 µm. After implantation of aluminum ions, aluminum ions were activated by annealing treatment in an argon gas atmosphere. Thereafter, a heat-oxidized film for protecting was formed on the element surface.

On the front and back surfaces of the resulting substrate, a cathode electrode and an anode electrode were deposited using an electron beam heat deposition device. The cathode electrode was formed by depositing Ni (350 nm thick) on the backside surface of the substrate, and the anode electrode was formed by depositing a Ti film (100 nm thick) and an Al film (350 nm thick) in this order on the upper surface of the p+ type contact layer. After the deposition of these electrodes, heat treatments for the cathode electrode and the anode electrode were carried out at 1050° C. for 90 sec and at 900° C. for 180 sec, respectively to form an alloy with SiC and thereby an ohmic electrode was prepared.

Using the pn diode thus prepared, the following on-state forward bias operation test was carried out. The cathode electrode of the pn diode was adhered on a copper plate using a high melting point solder, and then an aluminum wire was bonded on the anode electrode using an ultrasonic bonding device. The copper plate and the aluminum wire are connected to an electric current source and a voltmeter. While the pn diode was kept under a temperature condition of 350° C., a direct current of 100 A/cm$^2$ was passed in the forward direction for 60 min. Successively, heating was carried out at 350° C. for 1 hr. Thereafter, the voltage in the forward direction was measured. The results are shown in FIG. 3.

Example 2

Using the pn diode same as prepared in Example 1, an on-state forward bias operation test was carried out in the same conditions as in Example 1. Successively, heating was carried out at 400° C. for 1 hr. Thereafter, the voltage in the forward direction was observed. The results are shown in FIG. 3.

Example 3

Using the pn diode same as prepared in Example 1, an on-state forward bias operation test was carried out in the same conditions as in Example 1. Successively, heating was carried out at 500° C. for 1 hr. Thereafter, the voltage in the forward direction was observed. The results are shown in FIG. 3.

Example 4

Using the pn diode same as prepared in Example 1, an on-state forward bias operation test was carried out in the same conditions as in Example 1. Successively, heating was carried out at 600° C. for 1 hr. Thereafter, the voltage in the forward direction was observed. The results are shown in FIG. 3.

Comparative Example 2

Using the pn diode same as prepared in Example 1, an on-state forward bias operation test was carried out in the same conditions as in Example 1. Successively, heating was carried out at 300° C. for 1 hr. Thereafter, the voltage in the forward direction was observed. The results are shown in FIG. 3.

Comparative Example 2

Using the pn diode same as prepared in Example 1, an on-state forward bias operation test was carried out in the same conditions as in Example 1. Successively, the voltage in the forward direction was observed without heating. The results are shown in FIG. 3. The voltage before the energizing test is also shown in FIG. 3.

Example 5

Figure 4:
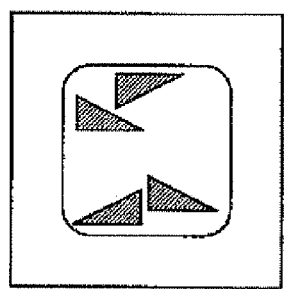
FIG. 4 are views showing results of observation for a photoluminescence image of a SiC epitaxial film after heating a pn diode at each temperature up to 600° C. after on-state forward bias operation.
Figure 4:
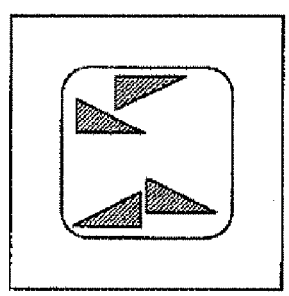
Figure 4:
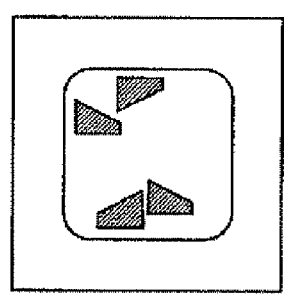
Figure 4:
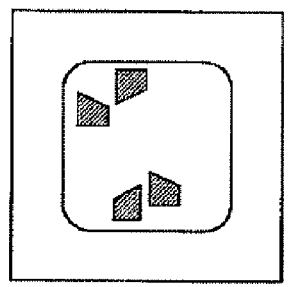
Figure 4:
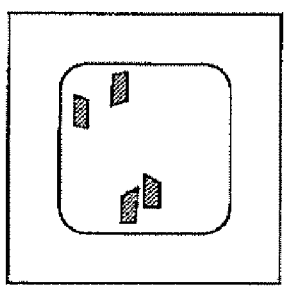
Figure 4:
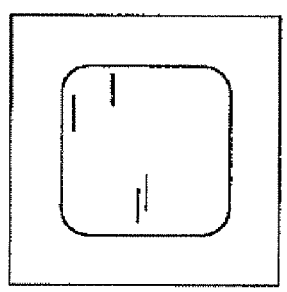

Using the pn diode same as prepared in Example 1, an on-state forward bias operation test was carried out. Successively, the pn diode was heated at 350° C. for a prescribed time. Thereafter, the photoluminescence image of the SiC epitaxial film after heating was observed. The results are shown in FIG. 4.

Example 6

Using the pn diode same as prepared in Example 1, an on-state forward bias operation test was carried out. Successively, the pn diode was heated at 400° C. for a prescribed time. Thereafter, the photoluminescence image of the SiC epitaxial film after heating was observed. The results are shown in FIG. 4.

Example 7

Using the pn diode same as prepared in Example 1, an on-state forward bias operation test was carried out. Successively, the pn diode was heated at 500° C. for a prescribed time. Thereafter, the photoluminescence image of the SiC epitaxial film after heating was observed. The results are shown in FIG. 4.

Example 8

Using the pn diode same as prepared in Example 1, an on-state forward bias operation test was carried out. Successively, the pn diode was heated at 600° C. for a prescribed time. Thereafter, the photoluminescence image of the SiC epitaxial film after heating was observed. The results are shown in FIG. 4.

Comparative Example 3

Using the pn diode same as prepared in Example 1, an on-state forward bias operation test was carried out. Successively, the pn diode was heated at 300° C. for a prescribed time. Thereafter, the photoluminescence image of the SiC epitaxial film after heating was observed. The results are shown in FIG. 4.

Comparative Example 4

Using the pn diode same as prepared in Example 1, an on-state forward bias operation test was carried out. Successively, the photoluminescence image of the SiC epitaxial film was observed (heating was not carried out). The results are shown in FIG. 4.

The invention claimed is:

1. A method for recovering an on-state forward voltage in a bipolar semiconductor device such that electrons and holes are recombined in a silicon carbide epitaxial film grown on the surface of a silicon carbide single crystal substrate at the time of on-state forward bias operation, the method comprising:
   increasing the on-state forward voltage in the bipolar semiconductor device by an on-state forward bias operation; and
   heating the bipolar semiconductor device in a condition of stopping the on-state forward bias operation at a temperature between 400° C. and 800° C.

2. The method for recovering an on-state forward voltage in a bipolar semiconductor device according to claim 1 wherein using a temperature-controlling device for heating the bipolar semiconductor device, the bipolar semiconductor device is heated at a temperature between 400° C. and 800° C.

3. The method for recovering an on-state forward voltage in a bipolar semiconductor device according to claim 1 wherein the bipolar semiconductor device used in the method comprises a hexagonal silicon carbide single crystal substrate such that a hexagonal silicon carbide epitaxial film is grown on the surface of the substrate.

4. The method for recovering an on-state forward voltage in a bipolar semiconductor device according to claim 3 wherein the bipolar semiconductor device used in the method comprises a 4H silicon carbide single crystal substrate such that a 4H silicon carbide epitaxial film is grown on the surface thereof, a 6H silicon carbide single crystal substrate such that a 6H silicon carbide epitaxial film is grown on the surface thereof, or a 2H silicon carbide single crystal substrate such that a 2H silicon carbide epitaxial film is grown on the surface thereof.

5. The method for recovering an on-state forward voltage in a bipolar semiconductor device according to claim 1 wherein the bipolar semiconductor device used in the method comprises a 15R silicon carbide single crystal substrate such that a 15R silicon carbide epitaxial film is grown on the surface thereof.

6. A method for shrinking stacking faults in a bipolar semiconductor device such that electrons and holes are recombined in a silicon carbide epitaxial film grown on the surface of a silicon carbide single crystal substrate at the time of on-state forward bias operation, the method comprising:
   increasing the on-state forward voltage in the bipolar semiconductor device by an on-state forward bias operation; and
   heating the bipolar semiconductor device in a condition of stopping the on-state forward bias operation at a temperature between 400° C. and 800° C.

7. The method for shrinking stacking faults in a bipolar semiconductor device according to claim 6 wherein using a temperature-controlling device for heating the bipolar semiconductor device, the bipolar semiconductor device is heated at a temperature between 400° C. and 800° C.

8. The method for shrinking stacking faults in a bipolar semiconductor device according to claim 6 wherein the bipolar semiconductor device used in the method comprises a hexagonal silicon carbide single crystal substrate such that a hexagonal silicon carbide epitaxial film is grown on the surface of the substrate.

9. The method for shrinking stacking faults in a bipolar semiconductor device according to claim 8 wherein the bipolar semiconductor device used in the method comprises a 4H silicon carbide single crystal substrate such that a 4H silicon carbide epitaxial film is grown on the surface thereof, a 6H silicon carbide single crystal substrate such that a 6H silicon carbide epitaxial film is grown on the surface thereof, or a 2H silicon carbide single crystal substrate such that a 2H silicon carbide epitaxial film is grown on the surface thereof.

10. The method for shrinking stacking faults in a bipolar semiconductor device according to claim 6 wherein the bipolar semiconductor device used in the method comprises a 15R silicon carbide single crystal substrate such that a 15R silicon carbide epitaxial film is grown on the surface thereof.

\* \* \* \* \*

UNITED STATES PATENT AND TRADEMARK OFFICE
CERTIFICATE OF CORRECTION

PATENT NO.       : 8,455,269 B2
APPLICATION NO. : 12/376199
DATED            : June 4, 2013
INVENTOR(S)      : Miyanagi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 347 days.

Signed and Sealed this
Eighth Day of September, 2015

Michelle K. Lee
*Director of the United States Patent and Trademark Office*